(12) United States Patent
Noguchi et al.

(10) Patent No.: US 12,026,404 B2
(45) Date of Patent: *Jul. 2, 2024

(54) MEMORY DEVICE FOR SCHEDULING MAXIMUM NUMBER OF MEMORY MACROS WRITE OPERATIONS AT RE-ARRANGED TIME INTERVALS

(71) Applicant: Taiwan Semiconductor Manufacturing Company, Ltd., Hsinchu (TW)

(72) Inventors: Hiroki Noguchi, Hsinchu (TW); Shih-Lien Linus Lu, Hsinchu (TW); Yu-Der Chih, Hsin-Chu (TW); Yih Wang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/313,374

(22) Filed: May 8, 2023

(65) Prior Publication Data

US 2023/0273752 A1 Aug. 31, 2023

Related U.S. Application Data

(63) Continuation of application No. 16/985,240, filed on Aug. 5, 2020, now Pat. No. 11,681,468.

(60) Provisional application No. 62/982,075, filed on Feb. 27, 2020.

(51) Int. Cl.
*G06F 3/06* (2006.01)
*G06F 1/28* (2006.01)
*G06F 9/48* (2006.01)

(52) U.S. Cl.
CPC ............. *G06F 3/0659* (2013.01); *G06F 1/28* (2013.01); *G06F 3/0604* (2013.01); *G06F 3/0673* (2013.01); *G06F 9/4893* (2013.01)

(58) Field of Classification Search
CPC .... G06F 3/0659; G06F 3/0604; G06F 3/0673; G06F 1/28; G06F 9/4893
See application file for complete search history.

(56) References Cited

U.S. PATENT DOCUMENTS 11,681,468 B2 * 6/2023 Noguchi ............... G06F 3/0673
711/154

\* cited by examiner

*Primary Examiner* — Tammara R Peyton
(74) *Attorney, Agent, or Firm* — JCIPRNET

(57) ABSTRACT

A memory device including a memory array with a plurality of memory macros, a power supplying circuit, and a controller is provided. The power supplying circuit is coupled to the memory array. The controller is coupled to the memory array. The power supplying circuit is configured to provide power to perform write operations to a number of the memory macros at the same time. The number of the memory macros for the write operations performed at the same time is not higher than a maximum number of the memory macros. The controller obtains the maximum number of the memory macros for the write operations performed at the same time by the power supplying circuit. The controller re-arranges a schedule for a sequence of the write operations of the memory macros to generate a re-arranged schedule. The maximum number is taken as a threshold value. In the re-arranged schedule, a number of part of the memory macros for the write operations performed at the same time is equal to or less then the threshold value.

20 Claims, 8 Drawing Sheets

MEMORY DEVICE FOR SCHEDULING MAXIMUM NUMBER OF MEMORY MACROS WRITE OPERATIONS AT RE-ARRANGED TIME INTERVALS

CROSS-REFERENCE TO RELATED APPLICATION

This application is a continuation application of and claims the priority benefit of U.S. application Ser. No. 16/985,240, filed on Aug. 5, 2020, now allowed, which claims the priority benefit of U.S. provisional application Ser. No. 62/982,075, filed on Feb. 27, 2020. The entirety of each of the above-mentioned patent applications is hereby incorporated by reference herein and made a part of this specification.

BACKGROUND

The disclosure relates to a technology for a memory device, and more particularly a memory device and a scheduling method for writing memory macros of the memory device according to a write arbitration.

Recently, the technological advance of the memory device is the ability to detect the failure of the memory device and further to correct its failure. The failure of the memory device may be caused by the failure of the memory device to correctly write the data into the memory macros during write operations. However, the amount of data being able to be corrected is restricted or limited by the ability of the correction algorithms itself. Therefore, the failed data is not able to be fully corrected. Instead of detecting the failure of the memory device to correctly write the data into the memory macros, preventing the memory device to incorrectly write the data into the memory macros is more important.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DESCRIPTION OF THE EMBODIMENTS

Figure 1:
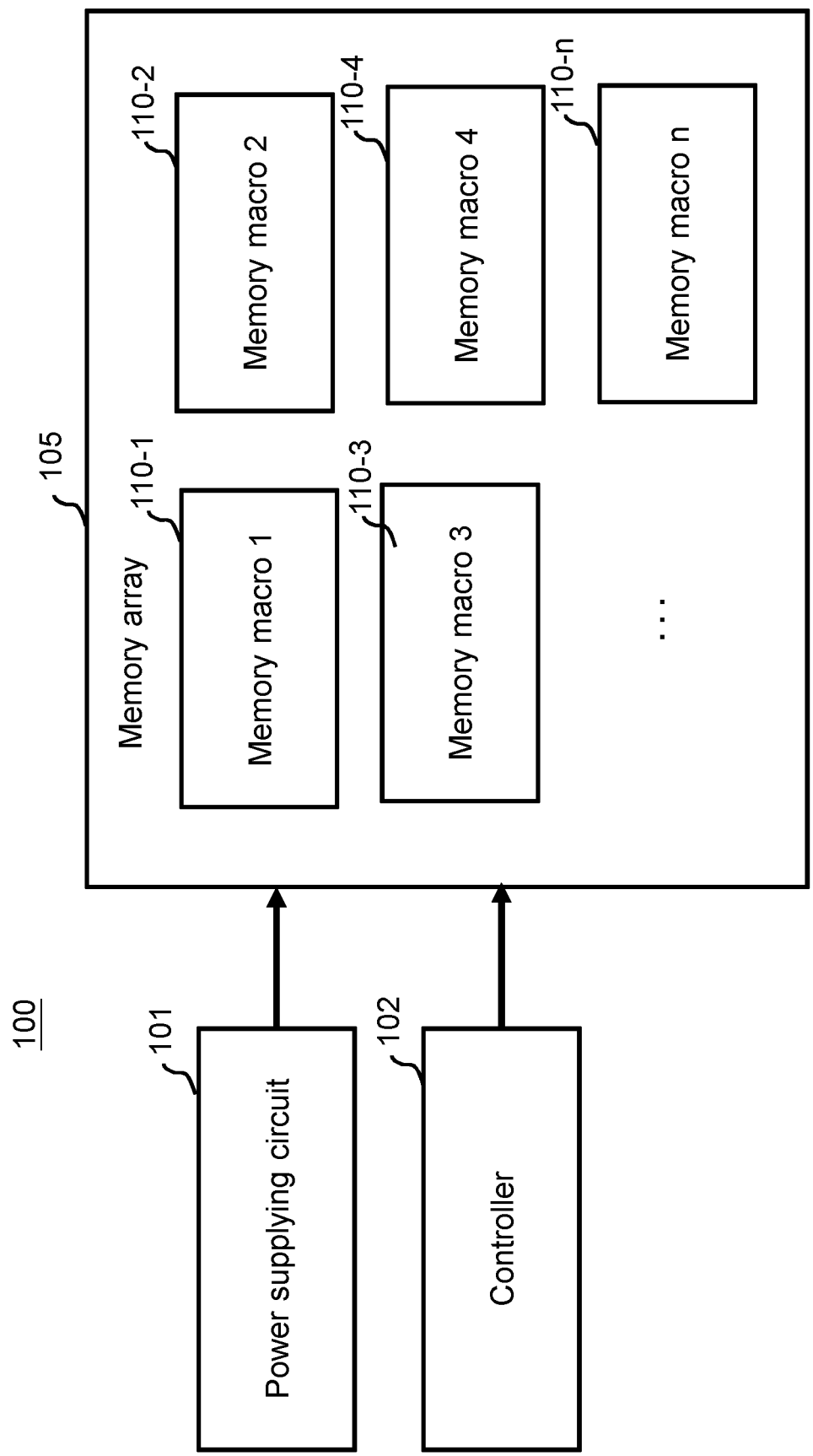
FIG. 1 illustrates a block diagram of a memory device with a plurality of memory macros according to an embodiment of the disclosure.

The following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure discloses a technique to prevent incorrectly write the data in the memory device. Specifically, the incorrectness of writing the data into the memory macros can be caused by lack of power generated by a power supplying circuit to write the data into the memory macros during the write operations. Since the power generated by the power supplying circuit is limited, a number of memory macros being written at the same time should be limited in order to provide sufficient power to each memory macros being written at the same time. Therefore, a write arbitration technique is proposed to address this issue.

The write arbitration technique is implemented by detecting the number of the memory macros being written at the same time. The detected number is then compared with a predetermined threshold. If the detected number is greater than the predetermined threshold, then the number of the memory macros being written at the same time needs to be reduced to meet the predetermined threshold requirement. Thus, the write operation of the memory macros needs to be scheduled, as such, if the number of the memory macros being written at the same time is greater than the predetermined threshold, a part of memory macros can be re-scheduled to a next write operation. How to choose the part of memory macros being written to the next write operation will be elaborated in detail in following sections.

FIG. 1 illustrates a block diagram of a memory device with a plurality of memory macros according to an embodiment of the disclosure. The memory device 100 may be implemented as a storage or a consumer electronic device with memory array. In the embodiment, the memory device 100 maybe an EEPROM, a DRAM, a flash memory, or any one of a volatile/non-volatile memory.

Referring to FIG. 1, the memory device 100 includes a memory array 105 with a plurality of memory macros 110-1 to 110-$n$, a power supplying circuit 101, and a controller 102. The power supplying circuit 101 is coupled to the memory array 105. The controller 102 is coupled to the memory array 105. The number of n is a positive integer. In the embodiment, the controller 102 may be a processor, a field programmable gate array (FPGA), an application specific integrated circuit (ASIC), or any integrated programmable on chip.

Figure 2:
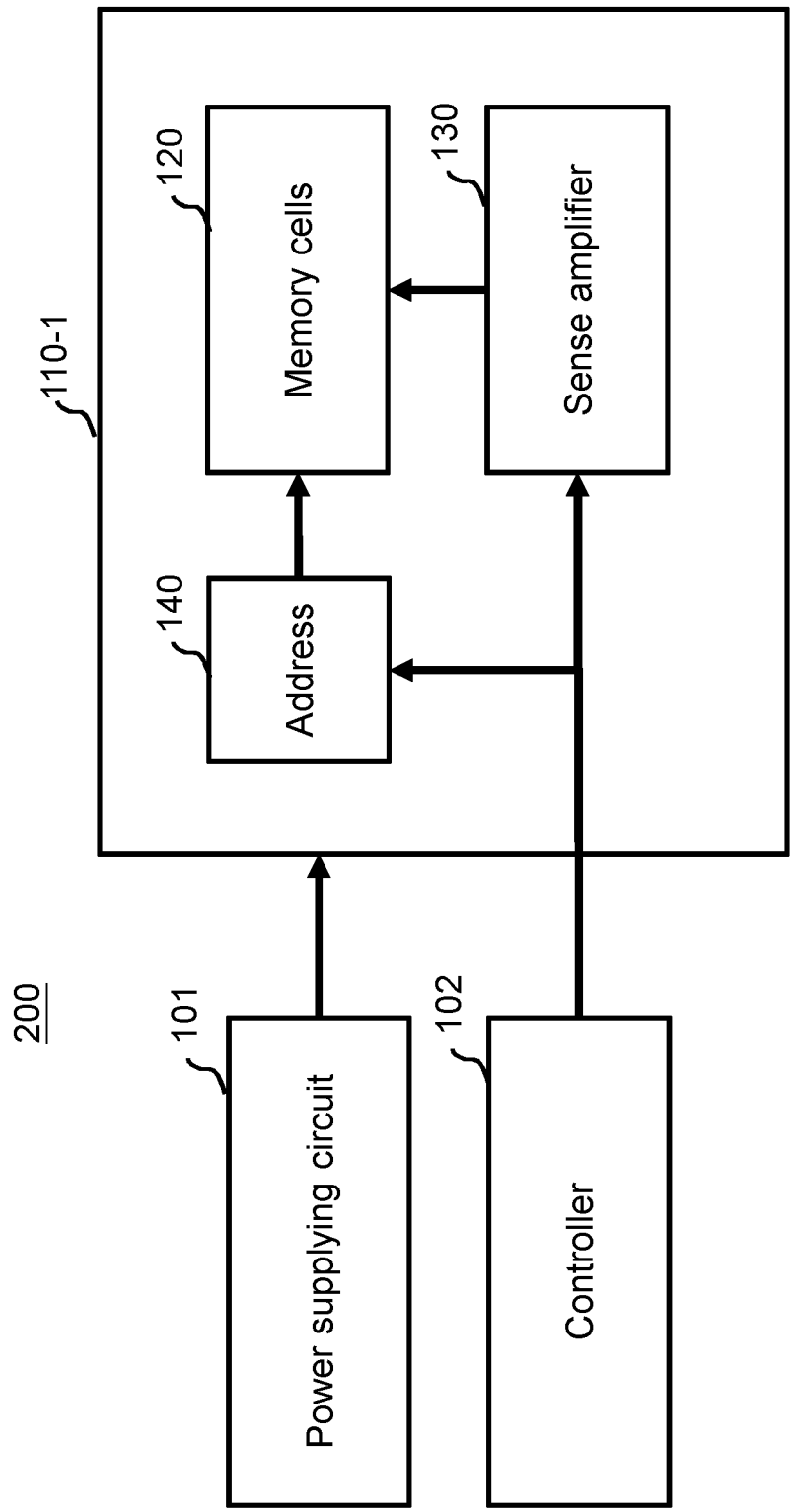
FIG. 2 illustrates a block diagram of a memory macro including a sense amplifier and memory cells selected via an address according to an embodiment of the disclosure.

FIG. 2 illustrates a block diagram of a memory macro including a sense amplifier and memory cells selected via an address according to an embodiment of the disclosure. The memory device 200 illustrated in FIG. 2 is the same as memory device 100 illustrated in FIG. 1. The memory device 200 illustrates an example of the controller 102 and the power supplying circuit 101 controlling and providing power to the memory macro 110-1. The controller 102 and the power supplying circuit 101 may controls and provides power to the plurality of the memory macros 110-1 to 110-$n$.

Referring to FIG. 2, each memory macro (i.e., 110-1) from the plurality of the memory macros 110-1 to 110-$n$ includes a memory cells 120, a sense amplifier 130, and an address 140. The controller 102 is coupled to the address 140 and the sense amplifier 130. The address 140 is coupled to the memory cells 120. The sense amplifier 130 is coupled to the memory cells 120. The controller 102 reads or writes the memory cells 120 via the address 140. The controller 102 reads the memory cells 120 using the sense amplifier 130. The address 140 may be implemented as a decoder. The sense amplifier 130 may be implemented as a comparator and amplifier circuit. The comparator and amplifier circuit may be composed by a plurality of resistors, a plurality of resistors, a plurality of the transistor, and a plurality of electronic circuits.

In the embodiment of FIG. 1 and FIG. 2, the power supplying circuit 101 is configured to provide power to perform write operations to a number of the memory macros (i.e., 110-1 to 110-2) at the same time. The number of the memory macros (i.e., 110-1 to 110-2) for the write operations performed at the same time is not higher than a maximum number of the memory macros. The maximum number of the memory macros maybe 1, 2, or any integer number greater than 2. For example, the maximum number of the memory macros is 2. Since the maximum number of the memory macros is 2, the power supplying circuit 101 may be configured to provide power to the memory macro 110-1 and the memory macro 110-2 at the same time. Since the maximum number of the memory macros is 2, the power supplying circuit 101 may be configured to provide power to the memory macro 110-1 and the memory macro 110-3 at the same time. Since the maximum number of the memory macros is 2, the power supplying circuit 101 may be configured to provide power to the memory macro 110-3. The power supplying circuit 101 may be configured to provide power to 1 or 2 memory macros from the plurality of the memory macros 110-1 to 110-$n$. For example, the maximum number of the memory macros is 3. Since the maximum number of the memory macros is 3, the power supplying circuit 101 may be configured to provide power to the memory macro 110-1, the memory macro 110-2, and the memory macro 110-3 at the same time. Since the maximum number of the memory macros is 3, the power supplying circuit 101 may be configured to provide power to the memory macro 110-1 and the memory macro 110-3 at the same time. Since the maximum number of the memory macros is 3, the power supplying circuit 101 may be configured to provide power to the memory macro 110-2. The power supplying circuit 101 may be configured to provide power to 1, 2, or 3 memory macros from the plurality of the memory macros 110-1 to 110-$n$. That is, the power supplying circuit 101 is configured to provide power to the maximum number of the memory macros from the plurality of the memory macros 110-1 to 110-$n$. Therefore, the memory macros for the write operations performed at the same time have enough power provided by the power supplying circuit 101, as such, the failure of writing the memory macros is able to be decreased.

In this embodiment, the controller 102 obtains the maximum number of the memory macros for the write operations performed at the same time by the power supplying circuit 101. The controller 102 re-arranges a schedule for a sequence of the write operations of the memory macros 110-1 to 110-$n$ to generate a re-arranged schedule. The maximum number of the memory macros obtained by the controller 102 refers to the maximum number as previously described. The maximum number is further taken as a threshold value for write operation. The re-arranged schedule for the sequence of the write operation generated by the controller 102 maybe different from the sequence of the write operation before the re-arrangement. The re-arranged schedule is generated according to the maximum number of the memory macros. For example, the power supplying unit 101 is only able to provide power to 2 memory macros (i.e., 110-1 and 110-2), which is the maximum number is 2. And the write operation to the memory macros 110-1 to 110-3 is performed in the first interval T1 (FIG. 3) of the sequence of the write operation before the re-arrangement. Since the maximum number is 2 and a number of part of the memory macros for the write operations performed at the same time is 3, the controller 102 re-arranges the schedule for a sequence of the write operation by choosing the memory macros 110-1 and 110-2 for the write operations performed at the first interval T1. The detail description of generating the re-arranged schedule will be further elaborated in FIGS. 3 to 5.

Figure 7:
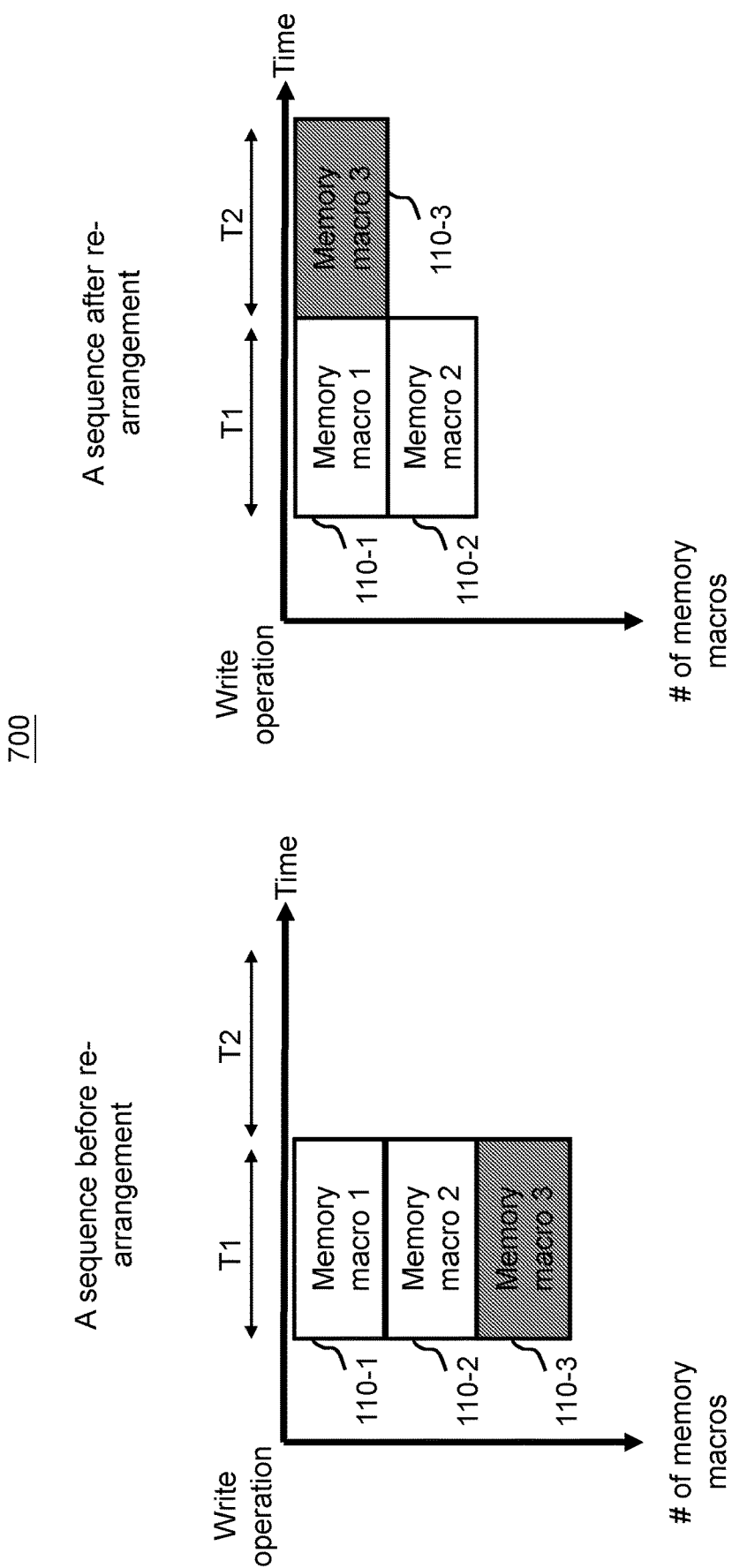
FIG. 7 illustrates a comparison between a sequence of write operations before re-arrangement and after re-arrangement according to an embodiment of the disclosure.

In this embodiment, in the re-arranged schedule, the number of part of the memory macros for the write operations performed at the same time is equal to or less then the threshold value. For example, the threshold value is 2. Referring to the schedule or the sequence of the write operations 700 of FIG. 7, in the schedule before re-arrangement, the memory macros 110-1 to 110-3, which is part of the memory macros 110-1 to 110-$n$, is located in the same interval for being performed the write operation. Since the threshold value is 2 and the number of part of the memory macros is 3 (memory macros 110-1 to 110-3), the controller 102 re-arranges the schedule for the write operation of the memory macros 110-1 to 110-3. The memory macros 110-1 and 110-2 is re-arranged to the first interval T1, and the memory macro 110-3 is re-arranged to the second interval T2. That is, after re-arrangement, the number of part of the memory macros (110-1 and 110-2) for the write operations performed at the first interval T1 is equal to the threshold value, and the number of part of the memory macros (110-3) for the write operations performed at the first interval T2 is less than the threshold value. As results, the power supplying circuit 101 is able to provide enough power to the memory macros being performed the write operation, and the memory macros do not need to wait too long for being written. Thus, the write error rate can be reduced, and a write latency can be minimized.

Figure 3:
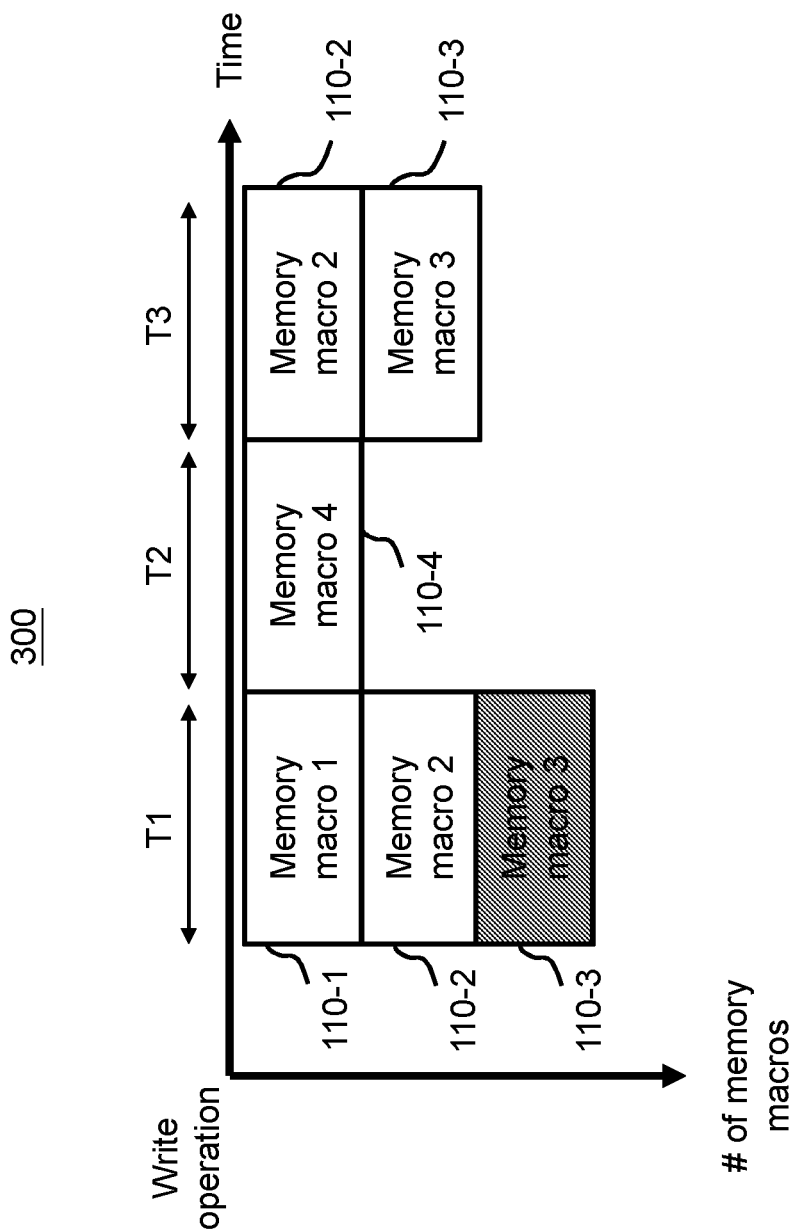
FIG. 3 illustrates a sequence of write operations including a number of memory macros before a schedule re-arrangement according to an embodiment of the disclosure.
Figure 4:
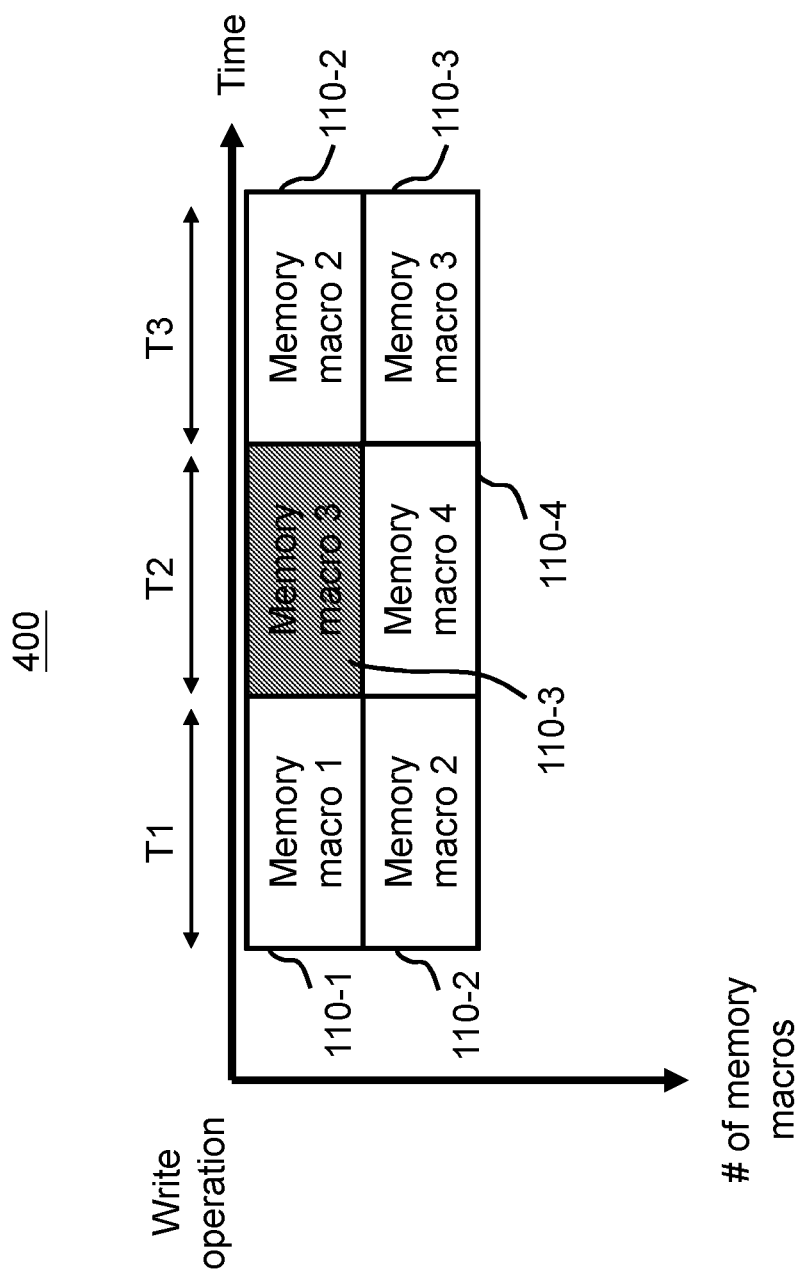
FIG. 4 illustrates a sequence of write operations after a schedule re-arrangement based on a FIFO rule according to an embodiment of the disclosure.

In some embodiments of the disclosure, the schedule is re-arranged according to a first-input first-output (FIFO)

rule. FIG. 3 illustrates a sequence of a write operation including a number of memory macros before a schedule re-arrangement according to an embodiment of the disclosure. FIG. 4 illustrates a sequence of a write operation after a schedule re-arrangement based on a FIFO rule according to an embodiment of the disclosure.

Referring to FIG. 3, the sequence of the write operations 300 includes first interval, second interval, and third interval. Each interval represents that the memory macros are scheduled the write operation at the same time. A number of intervals maybe any one of positive integer number. A number of the memory macros is designated as a vertical axis. A time interval is designated as a horizontal axis.

In the embodiment of FIG. 3, the write operations of the memory macros 110-1 to 110-3 are scheduled at the first interval T1. And then, the write operations of the memory macro 110-4 is scheduled at the second interval T2. And then, the write operations of the memory macros 110-1 to 110-2 are coming again and scheduled at the third interval T3. The sequence of the write operations 300 may suffer from a write error condition if the power supplying circuit 101 has a limitation to provide power to a maximum number of the memory macros being written at the same time. For example, the maximum number of the memory macros being written at the same time is 2. In other words, the power supplying unit 300 can merely provide power to 2 memory macros being written at the same time. If the number of the memory macros being written at the same time is larger than 2 (i.e., 3), then the memory macros may suffer from a failure or writing error. Thus, the number of the memory macros being written at the same time for each time interval should be maintained to be equal to or less than the maximum number (i.e., 2). The controller 102 re-arranges the schedule for the sequence of the write operation being performed to the memory macros 110-1 to 110-3. The re-arranged sequence is provided in FIG. 4.

Referring to FIG. 4, the sequence of the write operations 400 is re-arranged according to the FIFO rule. The sequence of the write operations 400 includes first interval, second interval, and third interval. Each interval represents that the memory macros are scheduled the write operation at the same time. A number of intervals maybe any one of positive integer number. A number of the memory macros is designated as a vertical axis. A time interval is designated as a horizontal axis.

In the embodiment of FIG. 4, the write operations of the memory macros 110-1 and 110-2 are re-scheduled at the first interval T1. The memory macros 110-1 and 110-2 are selected as the memory macros being written at the first interval T1 according to the FIFO rule. To be detail, referring to time interval T1 of FIG. 3, the memory macro 110-1 came first, and the memory macro 110-2 came after the memory macro 110-2, and the memory macro 110-3 came after the memory macro 110-2. Since the memory macros 110-1 and 110-2 came before the memory macro 110-3, the write operations are performed to the memory macros 110-1 and 110-2, referring to time interval T1 of FIG. 4, at the first interval T1. Accordingly, referring to time interval T2 of FIG. 4, since the memory macro 110-3 came later than the memory macros 110-1 and 110-2, the write operation being performed to the memory macro 110-3 is re-arranged at the second time interval T2. At the same time, the write operation is performed to the memory macro 110-4 at the second interval T2. And then, the write operations of the memory macros 110-1 to 110-2 are coming again and scheduled at the third interval T3. The sequence of the write operations 400 is able to avoid the write error condition because the power supplying circuit 101 provide power to the number of the memory macros which is equal to or less than the maximum number of the memory macros being written at the same time (i.e., 2). In other words, the number of the memory macros being written at the same time for each time interval is able to be maintained to be equal to or less than the maximum number. Thus, the write error caused by an insufficient power provided by the power supplying circuit 101 to the memory macros for the write operations performed at the same time is able to be avoid, as such, the write error rate can be reduced.

Figure 5:
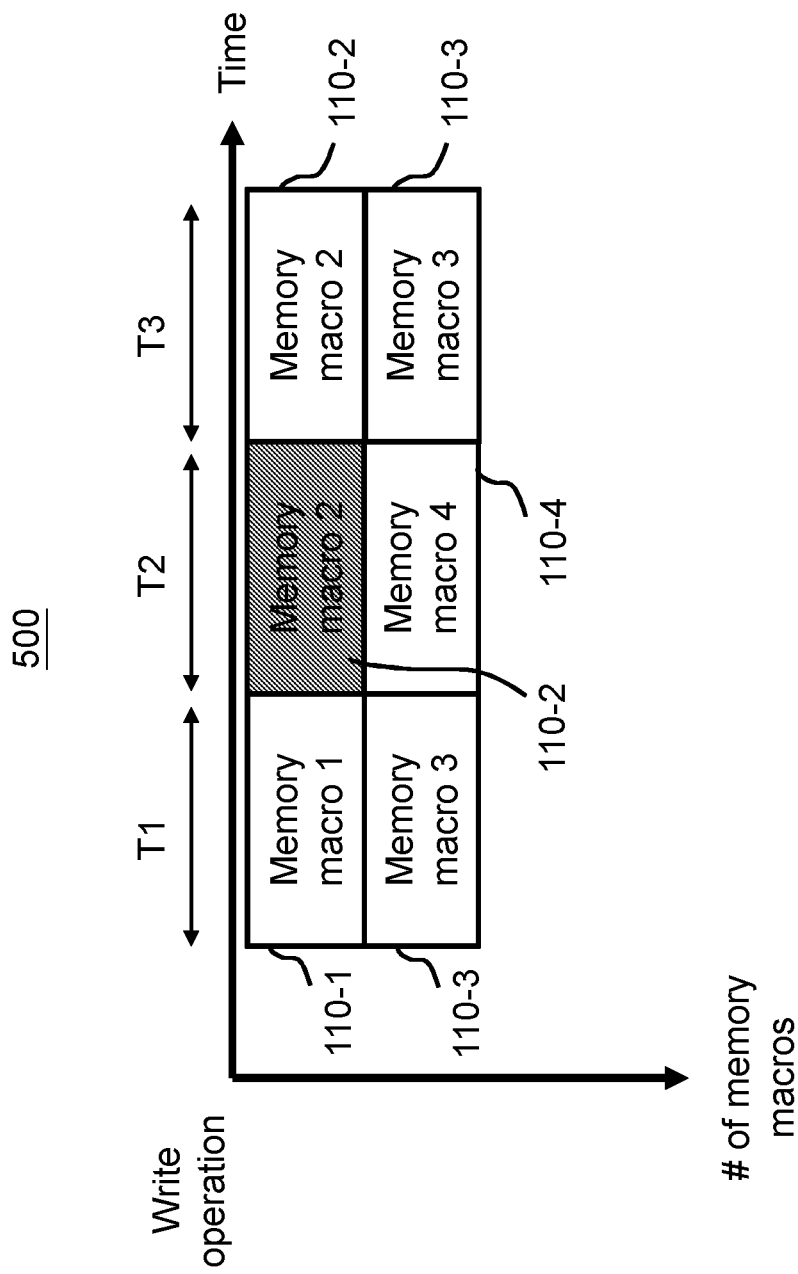
FIG. 5 illustrates a sequence of write operations after a schedule re-arrangement based on a FIFO rule and a priority flag according to an embodiment of the disclosure.

In some embodiments of the disclosure, the schedule is re-arranged according to a priority flag of each write operations of a corresponding memory macro and the FIFO rule. FIG. 5 illustrates a sequence of write operations after a schedule re-arrangement based on the FIFO rule and a priority flag according to an embodiment of the disclosure.

Referring to FIG. 4 and FIG. 5, the difference between the sequence of the write operations 500 of FIG. 5 and the sequence of the write operations 400 of FIG. 4 is located at the first interval T1 and the second interval T2. At the first interval T1 of FIG. 4, the write operations are scheduled for the memory macros 110-1 and 110-2 in response to the FIFO rule. On the other hand, referring to FIG. 3 and FIG. 5, at the first interval T1 of FIG. 5, the write operations are scheduled for the memory macros 110-1 and 110-3 in response to the priority flag of the write operations of the memory macros 110-1 to 110-3 at the first interval T1 of FIG. 3 and the FIFO rule.

For example, the maximum number or the threshold value of the memory macros for the write operations performed at the same time is 2. The write operations of the memory macros 110-1 to 110-3 are scheduled at the first interval T1. The write operation of the memory macro 110-4 is scheduled at the second interval T2. The write operations of the memory macros 110-2 and 110-3 are coming again and scheduled at the third interval T3. Since the number of the memory macros for the write operations performed at the first interval T1 is greater than the threshold value, the memory macros for the write operations performed at the first interval T1 should be re-arranged according to the priority flag and the FIFO rule. In this example, at the first interval T1, the memory macro 110-3 has the priority flag, and the memory macros 110-1 110-2 have no priority flags. Since the memory macro 110-1 is came before the memory macros 110-2 and 110-3 and the memory macro having the priority flag is the memory macro 110-3, the memory macros for the write operations performed at the first interval T1 is the memory macros 110-1 and 110-3. And the write operation for the memory macro 110-2 is re-arranged at the second interval T2. At the same time, the memory macro 110-4 is performed the write operation at the second interval T2. And then, the memory macros 110-2 and 110-3, which are come again, are performed the write operations at the third interval T3. That is, the sequence of the memory macros being performed the write operations is re-arranged according to the priority flag of each write operations conducted at the same time and the FIFO rule. As results, the memory macros for the write operations performed at the same time are provided with sufficient power, as such, the write error of the memory macros can be avoided and the write error rate can be reduced.

Figure 6:
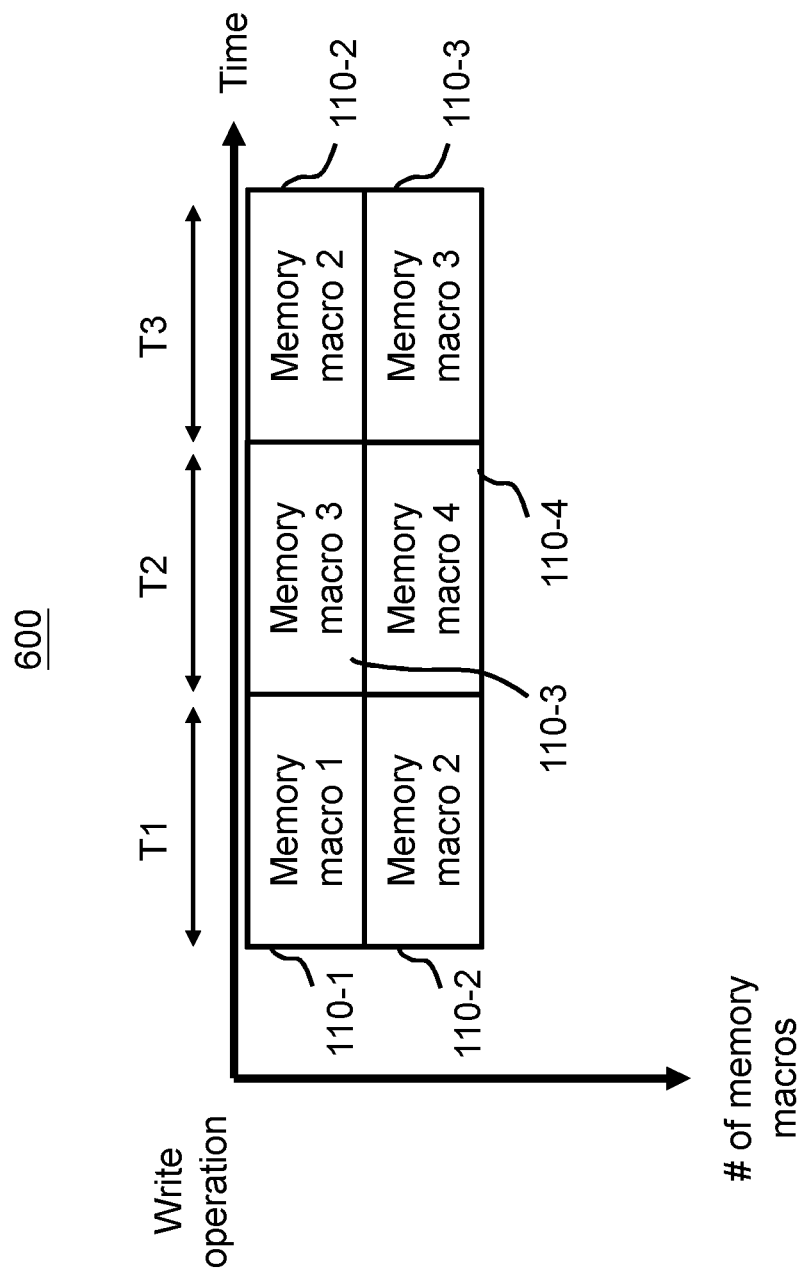
FIG. 6 illustrates a sequence of write operations in condition which a schedule re-arrangement is not needed according to an embodiment of the disclosure.

In some embodiments of the disclosure, a first write operation is performed after a second write operation while the schedule for the sequence of the write operations of the memory macros are not re-arranged. FIG. 6 illustrates a sequence of write operations in condition which a schedule re-arrangement is not needed according to an embodiment of the disclosure.

Referring to FIG. 3 and FIG. 6, the difference between the sequence of the write operations 600 of FIG. 6 and the sequence of the write operations 300 of FIG. 3 is located at the first interval T1 and the second interval T2. At the first interval T1 of FIG. 6, the write operations are scheduled for the memory macros 110-1 and 110-2. On the other hand, at the first interval T1 of FIG. 3, the write operations are scheduled for the memory macros 110-1 to 110-3. At the second interval T2 of FIG. 6, the write operations are scheduled for the memory macros 110-3 and 110-4. On the other hand, at the second interval T2 of FIG. 3, the write operations are scheduled for the memory macro 110-4.

In the embodiment of FIG. 6, for example, the threshold value is 2 and the number of the memory macros for the write operations performed at the same time is 2. Specifically, the memory macros 110-1 and 110-2 are performed the write operations at the first interval T1. The memory macros 110-3 and 110-4 are performed the write operations at the second interval T2. The memory macros 110-2 and 110-3 are came again and performed the write operations at the third interval T3. The write operations to the memory macro 110-3 and the memory macro 110-2 are, for example, called as the first write operation and the second write operation respectively. Since the first write operation is performed at the second interval T2 and the second write operation is performed at the first interval T1, the first write operation if performed after the second write operation. That is, in condition which the number of the memory macros for the write operations performed at the same time is 2 and the threshold value is 2, the sequence of the write operation of the memory macros are not re-arranged. In other words, the sequence of the write operation of the memory macros are not re-arranged if the number of the memory macros for the write operations performed at the same time is equal to or less than the threshold value.

In another embodiment, the first write operation is performed before the second write operation in response to a value of the priority flag of a first write operation is greater than a value of the priority flag of a second write operation and the re-arranged schedule is performed. For example, referring to the sequence of the write operations 300 of FIG. 3 which is the sequence of the write operations before the schedule re-arrangement, the threshold value is 2. The memory macros 110-1 to 110-3 are performed the write operations at the first interval T1. The memory macro 110-4 is performed the write operation at the second interval T2. And the memory macros 110-2 and 110-3 are came again and performed the write operations at the third interval T3. Since the number of the memory macros for the write operations performed at the first interval T1 is greater than the threshold value, the sequence of the write operations 300 of FIG. 3 is re-arranged. FIG. 5 shows the sequence of write operations 500 after the schedule re-arrangement. The sequence of write operation 500 is re-arranged according to the priority flag of the write operation to the memory macro 110-2 and the memory macro 110-3. The write operations to the memory macro 110-3 and the memory macro 110-2 are called as the first write operation and the second write operation respectively. The value of the priority flag of the first write operation is greater than the second write operation. Since, the value of the priority flag of the first write operation is greater than the second write operation, the first write operation is performed before the second write operation. As shown at the first interval T1 and the second interval T2 of FIG. 5, the memory macro 110-3 is performed the write operation at the first interval T1 and the memory macro 110-2 is performed the write operation at the second interval T2. That is, in condition which the schedule re-arrangement is performed, the first write operation is performed before the second write operation in response to the value of the priority flag of the first write operation is greater than the value of the priority flag of the second write operation. As a result, since the number of the memory macros for the write operations performed at the same time is equal to or less than the threshold value, insufficient power provided by the power supplying unit 101 can be avoid. Thus, the write error generated by insufficient power received by the memory macros being programmed the write operations at the same time is able to be avoided, as such, the write error rate can be reduced.

In another embodiment, the controller 102 further checks the number of part of the memory macros for the write operations performed at the same time after the controller 102 receives the sequence of the write operations of the memory macros and the controller does not re-arrange the schedule. For example, the threshold value is 2. Referring to FIG. 1 and FIG. 6, the controller 102 has an access to the plurality of the memory macros 110-1 to 110-$n$ of the memory array 105. The controller 102 receives the sequence of the write operation of the memory macros (i.e., memory macros 110-1 to 110-4). The sequence of the write operation is constructed by the first interval T1, the second interval T2, and the third interval T3. Specifically, the memory macros 110-1 and 110-2 are performed the write operations at the first interval T1. The memory macros 110-3 and 110-4 are performed the write operations at the second interval T2. The memory macros 110-2 and 110-3 are came again and performed the write operations at the third interval T3. The controller 102 further checks the number of part of the memory macros for the write operations performed at the first interval T1, the second interval T2, and the third interval T3. As shown at the first interval T1 of FIG. 6, the number of part of the memory macros for the write operations performed at the same time is 2. The number of part of the memory macros for the write operations performed at the second interval T2 is 2. And the number of part of the memory macros for the write operations performed at the third interval T3 is 2. Since the number of the memory macros for the write operations performed at the first interval T1, the second interval T2, or the third interval T3 is equal to or less than the threshold value, the controller 102 does not re-arrange the schedule or the sequence of the write operations. That is, in response to the controller 102 does not re-arrange the sequence of the write operations, the power supplying circuit 101 is able to provide sufficient power to the memory macros for the write operations performed at the same time. As a result, the write error caused by the insufficient power provided by the power supplying circuit 102 to the memory macros for the write operations performed at the same time can be avoided, as such, the write error rate can be reduced.

In another embodiment, the controller 102 determines that the schedule for the sequence of the write operations of the memory macros needs to be re-arranged or not according to a checking result for the number of part of the memory macros for the write operations performed at the same time in the sequence of the write operations of the memory macros is equal to or less than the threshold value. For example, the threshold value is 2. Referring to FIG. 3, the memory macros 110-1 to 110-3 are performed the write operations at the first interval T1. The memory macro 110-4 is performed the write operation at the second interval T2. The memory macros 110-2 and 110-3 are came again and performed the write operations at the third interval T3. At the first interval T1, the controller 102 checks the number of part of the memory macros for the write operations performed at the same time. Since the number of part of the memory macros for the write operations performed at the same time is not equal to or not less than the threshold value, the controller 102 determines that the sequence of the write operation of the memory macros 110-1 to 110-3 at the first interval T1 needs to be re-arranged. At the third interval T3, the controller 102 checks the number of part of the memory macros for the write operations performed at the same time. Since the number of part of the memory macros for the write operations performed at the same time is equal to or less than the threshold value, the controller 102 determines that the sequence of the write operation of the memory macros 110-2 and 110-3 at the third interval T3 does not need to be re-arranged. That is, the controller 102 determines that the sequence of the write operation of the memory macros needs to be re-arranged or not in response to the checking result for the number of part of the memory macros for the write operations performed at the same time. Accordingly, the controller 102 re-arranges the sequence of the memory macros being performed the write operations if the number of part of the memory macros for the write operations performed at the same time is not equal to or not less than the threshold value. Accordingly, the controller 102 does not re-arrange the sequence of the memory macros being performed the write operations if the number of part of the memory macros for the write operations performed at the same time is equal to or less than the threshold value.

In another embodiment, the power supplying circuit is an analog circuit. For example, the analog circuit is composed by the plurality of electronic components including resistors, capacitors, transistors, and inductors. The analog circuits may include any electronic components in addition of the above-mentioned electronic components. The analog circuit may be implemented in the Printed Circuit Board (PCB). The analog circuit may be combined with other circuits to generate the analog signal. The analog circuit maybe a DC power supply or an AC power supply. The analog circuit maybe a combination of the DC power supply and the AC power supply. The analog circuit maybe Lithium-ion battery. The analog circuit maybe the transformer. The analog circuit maybe any circuit generating power, but not limited thereto.

In another embodiment, the memory device is an emerging memory device. The emerging memory device may be implemented by a volatile memory, a non-volatile memory, or a combination thereof. The emerging memory device maybe any memory devices embedded in any electronic devices. The emerging memory device maybe a ROM, an EPROM, an EEPROM, a RAM, a DRAM, and an SRAM.

Figure 8:
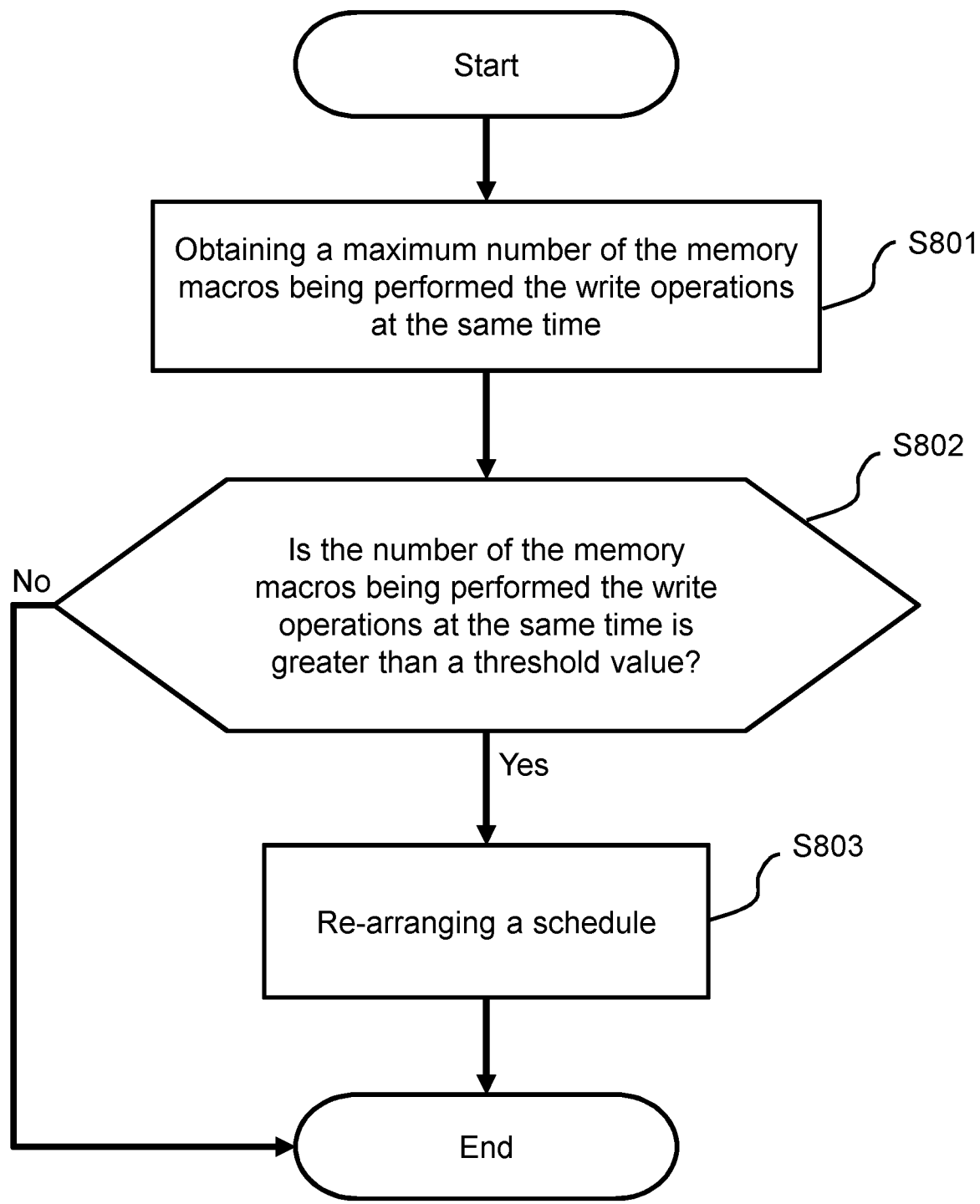
FIG. 8 illustrates a flowchart of determining a schedule re-arrangement according to an embodiment of the disclosure.

FIG. 8 illustrates a flowchart of determining a schedule re-arrangement according to an embodiment of the disclosure.

Referring to FIG. 8, the flowchart of determining a schedule re-arrangement may be performed according to the value of the priority flag, the FIFO rule, or the combination thereof, but not limited thereto.

In this exemplary embodiment, in step S801, the controller 102 obtains the maximum number of the memory macros for the write operations performed at the same time. The maximum number refers to the threshold value. For example, the threshold value is 2. Referring to FIG. 3, the number of the memory macros for the write operations performed at the first interval T1 is 3. The number of the memory macros for the write operations performed at the second interval T2 is 1. The number of the memory macros for the write operations performed at the third interval T3 is 2.

In step S802, the controller 102 check whether or not the number of the memory macros for the write operations performed at the same time is greater than the threshold value. For example, the threshold value is 2. At the first interval T1 of FIG. 3, the number of the memory macros for the write operations performed at the same time is 3. As a result, the number of the memory macros for the write operations performed at the first interval T1 of FIG. 3 is greater than the threshold value. At the third interval T3 of FIG. 3, the number of the memory macros for the write operations performed at the same time is 2. As a result, the number of the memory macros for the write operations performed at the third interval T3 of FIG. 3 is not greater than the threshold value.

In response to the number of the memory macros for the write operations performed at the same time is greater than the threshold value (step S802 is Yes), the controller 102 re-arranges the schedule or the sequence of the write operations. For example, referring to FIG. 4, the controller 102 re-arranged the sequence of the write operations at the first interval T1 in response to the number of the memory macro for the write operations performed at the first interval T1 is greater than the threshold value. Before the schedule re-arrangement, referring to FIG. 3, the memory macros 110-1 to 110-3 are performed the write operations at the first interval T1. After the schedule re-arrangement, referring to FIG. 4, the memory macros 110-1 and 110-2 are performed the write operations at the first interval T1.

In response to the number of the memory macros for the write operations performed at the same time is not greater than the threshold value (step S802 is No), the controller 102 does not re-arrange the schedule or the sequence of the write operations. For example, referring to FIG. 4, the controller 102 does not re-arrange the sequence of the write operations at the third interval T3 in response to the number of the memory macro for the write operations performed at the third interval T3 is not greater than the threshold value. Before the schedule re-arrangement, referring to FIG. 3, the memory macros 110-2 and 110-3 are performed the write operations at the third interval T3. After the schedule re-arrangement, referring to FIG. 4, the memory macros 110-2 and 110-3 are still performed the write operations at the third interval T3.

That is, whether or not the controller 102 re-arranges the schedule or the sequence of the write operations according to the threshold value and the number of the memory macros for the write operations performed at the same time. The controller 102 re-arranges the sequence of the write operations if the number of part of the memory macros for the write operations performed at the same time is greater than the threshold value. The controller 102 does not re-arrange the sequence of the write operations if the number of part of the memory macros for the write operations performed at the same time is not greater than the threshold value.

In summary, the memory device (i.e., 100) includes the memory array 105 with the plurality of the memory macros 110-1 to 110-$n$, the power supplying circuit 101, and the controller 102. The controller 102 checks the schedule for the sequence of the write operations. The controller 102 determines the number of the memory macros for the write operations performed at the same time. The controller 102 further determines whether or not the schedule for the sequence of the write operations needs to be re-arranged.

The controller 102 re-arranges the schedule for the sequence of the write operations in response to the number of the memory macros being performed the write operations is greater than the threshold value. The controller 102 does not re-arrange the schedule for the sequence of the write operations in response to the number of the memory macros being performed the write operations is not greater than the threshold value. The power supplying circuit 101 provides power to the memory macros for the write operations performed at the same time. Since the number of the memory macros for the write operations performed at the same time is able to be maintained. The power supplying circuit 101 provides sufficient power to the memory macros for the write operations performed at the same time. As a result, the write error caused by the insufficient power provided by the power supplying circuit 101 to the memory macros for the write operations performed at the same time is able to be avoid, as such, the write error rate can be reduced.

According to some embodiments, the memory device includes a memory array with a plurality of memory macros, a power supplying circuit, and a controller. The power supplying circuit is coupled to the memory array. The controller is coupled to the memory array. The power supplying circuit is configured to provide power to perform write operations to a number of the memory macros at the same time. The number of the memory macros for the write operations performed at the same time is not higher than a maximum number of the memory macros. The controller obtains the maximum number of the memory macros for the write operations performed at the same time by the power supplying circuit. The controller re-arranges a schedule for a sequence of the write operations of the memory macros to generate a re-arranged schedule. The maximum number is taken as a threshold value. In the re-arranged schedule, a number of part of the memory macros for the write operations performed at the same time is equal to or less then the threshold value.

According to some embodiments, the schedule is re-arranged according to a first-input first-output rule. According to some embodiments, the schedule is re-arranged according to a priority flag of each write operations of a corresponding memory macro and a first-input first-output rule. According to some embodiments, a first write operation is performed after a second write operation while the schedule for the sequence of the write operations of the memory macros are not re-arranged, and the first write operation is performed before the second write operation in response to a value of the priority flag of a first write operation is greater than a value of the priority flag of a second write operation and the re-arranged schedule is performed. According to some embodiments, the power supplying circuit is an analog circuit. According to some embodiments, the memory device is an emerging memory device. According to some embodiments, the controller further checks the number of part of the memory macros for the write operations performed at the same time after the controller receives the sequence of the write operations of the memory macros and the controller does not re-arrange the schedule.

According to some embodiments, a scheduling method for a memory device includes steps of obtaining a maximum number of the memory macros for the write operations performed at the same time by a power supplying circuit and re-arranging a schedule for a sequence of the write operations of the memory macros to generate a re-arranged schedule. According to some embodiments, the power supplying circuit provides power to perform write operations to a number of the memory macros at the same time. According to some embodiments, the number is not higher than a maximum number of the memory macros. According to some embodiments, the maximum number is taken as a threshold value. According to some embodiments, a number of part of the memory macros for the write operations performed at the same time is equal to or less then the threshold value in the re-arranged schedule.

According to some embodiments, the schedule is re-arranged according to a first-input first-output rule. According to some embodiments, the schedule is re-arranged according to a priority flag of each write operations of a corresponding memory macro and a first-input first-output rule. According to some embodiments, a first write operation is performed after a second write operation while the schedule for the sequence of the write operations of the memory macros are not re-arranged, and the first write operation is performed before the second write operation in response to a value of the priority flag of a first write operation is greater than a value of the priority flag of a second write operation and the re-arranged schedule is performed. According to some embodiments, the power supplying circuit is an analog circuit. According to some embodiments, the memory device is an emerging memory device. According to some embodiments, the scheduling method further includes the step of checking the number of part of the memory macros for the write operations performed at the same time after the sequence of the write operations of the memory macros is received and the schedule does not been re-arranged yet.

According to some embodiments, a memory device includes a memory array with a plurality of memory macros, a power supplying circuit, and a controller. The power supplying circuit is coupled to the memory array. The controller is coupled to the memory array. The power supplying circuit is configured to provide power to perform write operations to a number of the memory macros at the same time, wherein the number is not higher than a maximum number of the memory macros. The controller obtains the maximum number of the memory macros for the write operations performed at the same time by the power supplying circuit as a threshold value. The controller checks the number of part of the memory macros for the write operations performed at the same time in a sequence of the write operations of the memory macros while the controller receives the sequence of the write operations of the memory macros and the controller does not re-arrange the schedule yet. The controller determines that the schedule for a sequence of the write operations of the memory macros needs to be re-arranged or not according to a checking result for the number of part of the memory macros for the write operations performed at the same time in the sequence of the write operations of the memory macros is equal to or less than a threshold value.

According to some embodiments, the schedule is re-arranged according to a first-input first-output rule. According to some embodiments, the schedule is re-arranged according to a priority flag of each write operations of a corresponding memory macro and a first-input first-output rule. According to some embodiments, a first write operation is performed after a second write operation while the schedule for the sequence of the write operations of the memory macros are not re-arranged, and the first write operation is performed before the second write operation in response to a value of the priority flag of a first write operation is greater than a value of the priority flag of a second write operation and the re-arranged schedule is performed. According to some embodiments, the power supplying circuit is an analog circuit. According to some embodiments, the memory device is an emerging memory device.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A memory device, comprising:
a memory array with a plurality of memory macros;
a controller, coupled to the memory array,
wherein the controller obtains a maximum number for write operations performed on the memory macros at the same time and a schedule including a number of the memory macros for a sequence of the write operations to be performed on, and the controller re-arranges the schedule to generate a re-arranged schedule when the number is greater than the maximum number;
wherein, in the re-arranged schedule, the write operations performed on the memory macros are re-arranged in a plurality of time intervals, and a number of the memory macros to be written in each time interval is less than or equal to the maximum number.

2. The memory device of claim 1, wherein the schedule is re-arranged according to a first-input first-output rule.

3. The memory device of claim 1, wherein the schedule is re-arranged according to a priority flag of each write operations of a corresponding memory macro and a first-input first-output rule.

4. The memory device of claim 3, wherein a first write operation is performed after a second write operation while the schedule for the sequence of the write operations of the memory macros are not re-arranged, and
the first write operation is performed before the second write operation in response to a value of the priority flag of a first write operation is greater than a value of the priority flag of a second write operation and the re-arranged schedule is performed.

5. The memory device of claim 1, comprising a power supplying circuit configured to provide power lower than a maximum power, which allows the write operation to be performed to the maximum number of the memory macros at the same time, wherein the power supplying circuit is an analog circuit.

6. The memory device of claim 1, wherein the memory device is an emerging memory device.

7. The memory device of claim 1, wherein the controller further checks the number of how many the memory macros are for performing the write operations, and when the number is less than or equal to the maximum number, the controller does not re-arrange the schedule.

8. A scheduling method for a memory device, comprising:
obtaining a maximum number of how many memory macros are allowed for write operations to be performed on at the same time and a schedule including a number of the memory macros for a sequence of the write operations to be performed on; and
re-arranging the schedule to generate a re-arranged schedule when the number is greater than the maximum number,
wherein in the re-arranged schedule, the write operations performed on the memory macros are re-arranged in a plurality of time intervals, and a number of the memory macros to be written in each time interval is less than or equal to the maximum number.

9. The scheduling method of claim 8, wherein the schedule is re-arranged according to a first-input first-output rule.

10. The scheduling method of claim 8, wherein the schedule is re-arranged according to a priority flag of each write operations of a corresponding memory macro and a first-input first-output rule.

11. The scheduling method of claim 10, wherein a first write operation is performed after a second write operation while the schedule for the sequence of the write operations of the memory macros are not re-arranged, and
the first write operation is performed before the second write operation in response to a value of the priority flag of a first write operation is greater than a value of the priority flag of a second write operation and the re-arranged schedule is performed.

12. The scheduling method of claim 8, wherein a power supplying circuit is configured to provide power lower than a maximum power, which allows the write operation to be performed to the maximum number of the memory macros at the same time, wherein the power supplying circuit is an analog circuit.

13. The scheduling method of claim 8, wherein the memory device is an emerging memory device.

14. The scheduling method of claim 8, further comprising:
checking the number of how many the memory macros are for performing the write operations, and when the number is less than or equal to the maximum number, the schedule is not re-arranged.

15. A memory device, comprises
a memory array with a plurality of memory macros;
a controller, coupled to the memory array,
wherein the controller obtains a maximum number of the memory macros for the write operations performed at the same time,
the controller receives a schedule for a sequence of the write operations of the memory macros, and the controller checks a number of part of the memory macros for the write operations performed at the same time in the sequence of the write operations of the memory macros, and
the controller determines that the schedule to be re-arranged as a re-arranged schedule or not according to a checking result when the number is greater than the maximum number, such that the write operations performed on the memory macros are re-arranged in a plurality of time intervals in the re-arranged schedule, and a number of the memory macros to be written in each time interval is less than or equal to the maximum number.

16. The memory device of claim 15, wherein the schedule is re-arranged according to a first-input first-output rule.

17. The memory device of claim 15, wherein the schedule is re-arranged according to a priority flag of each write operations of a corresponding memory macro and a first-input first-output rule.

18. The memory device of claim 17, wherein a first write operation is performed after a second write operation while the schedule for the sequence of the write operations of the memory macros are not re-arranged, and the first write operation is performed before the second write operation in response to a value of the priority flag of a first write operation is greater than a value of the priority flag of a second write operation and the re-arranged schedule is performed.

19. The memory device of claim 15, comprising a power supplying circuit configured to provide power lower than a maximum power, which allows the write operation to be performed to the maximum number of the memory macros at the same time, wherein the power supplying circuit is an analog circuit.

20. The memory device of claim 15, wherein the memory device is an emerging memory device.

* * * * *